United States Patent [19]
Newns

[11] Patent Number: 6,128,178
[45] Date of Patent: Oct. 3, 2000

[54] VERY THIN FILM CAPACITOR FOR DYNAMIC RANDOM ACCESS MEMORY (DRAM)

[75] Inventor: Dennis Merton Newns, Yorktown Heights, N.Y.

[73] Assignee: International Business Machines Corporation, Armonk, N.Y.

[21] Appl. No.: 09/119,185

[22] Filed: Jul. 20, 1998

[51] Int. Cl.[7] .............................. H01G 4/002; H01G 4/33
[52] U.S. Cl. ........................ 361/305; 361/301.4; 257/306
[58] Field of Search ..................................... 361/305, 303, 361/301.4, 301.2, 301.1, 321.1–321.5; 257/306, 303

[56] References Cited

U.S. PATENT DOCUMENTS

| | | | |
|---|---|---|---|
| 5,155,658 | 10/1992 | Inam et al. | 361/321 |
| 5,479,317 | 12/1995 | Ramesh | 361/321.5 |
| 5,519,235 | 5/1996 | Ramesh | 257/295 |
| 5,760,432 | 6/1998 | Abe et al. | 257/295 |
| 5,986,301 | 11/1999 | Fukushima et al. | 257/306 |

FOREIGN PATENT DOCUMENTS

| | | | |
|---|---|---|---|
| 0 618 597 | 3/1994 | European Pat. Off. | H01G 1/01 |
| 5-90651 | 4/1993 | Japan | H01L 39/22 |

*Primary Examiner*—Kristine Kincaid
*Assistant Examiner*—Eric Thomas
*Attorney, Agent, or Firm*—McGinn & Gibb, P.C.

[57] ABSTRACT

A capacitor and a dynamic random access memory (DRAM) incorporating such a capacitor, includes a first layer of conducting, doped perovskite material, a second layer of another conducting, doped perovskite of opposite polarity in contact with the first layer, and a depletion layer formed at an interface between the first and second layers of conducting perovskite materials, the depletion layer being an insulating layer of the capacitor. Another capacitor and DRAM incorporating such a capacitor, includes a first electrode, a second electrode opposing the first electrode, and a thin-film of high dielectric constant perovskite material sandwiched between the first and second electrodes. At least one of the first and second electrodes is formed from substantially the same perovskite material, as the thin-film, in conducting, doped form.

26 Claims, 5 Drawing Sheets

400

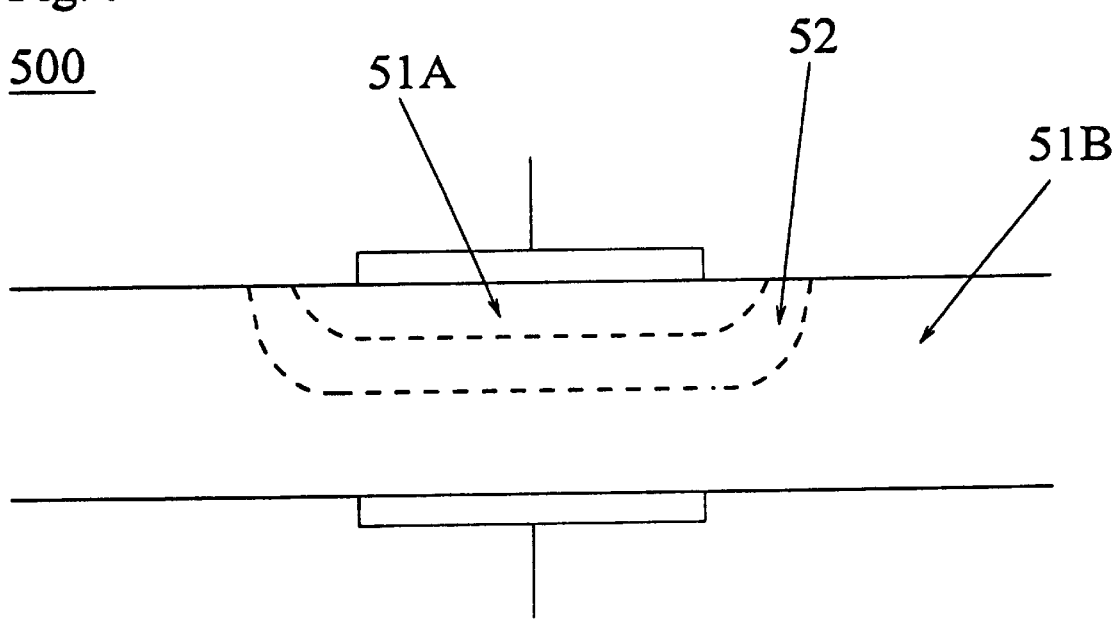

VERY THIN FILM CAPACITOR FOR DYNAMIC RANDOM ACCESS MEMORY (DRAM)

CROSS-REFERENCE TO RELATED APPLICATION

The present application is related to U.S. patent application Ser. No. 09/119,182, filed on Jul. 20, 1998, to D. M. Newns, assigned to the present assignee, and incorporated herein by reference.

BACKGROUND OF THE INVENTION

1. Field of the Invention

The present invention generally relates to a thin film electronic component, and more particularly to a very thin film capacitor for a dynamic random access memory (DRAM) and a method of forming the same.

2. Description of the Related Art

DRAM capacitors are required to store approximately $10^5$ electrons, but simultaneously to fit into the limited area per bit specified in the memory design. Moore's Law, whereby the density of circuits on a chip increases exponentially with time (e.g., doubling every x years) equivalently stipulates that the area per bit decreases exponentially with time (e.g., halving every x years). Hence, there is an increasing problem in fitting the specified capacitance into the ever-decreasing specified area.

Current DRAM capacitors are fabricated in silicon technology, and use deep trenches or exfoliated structures to get the specified capacitance into the area per bit. However, as memory densities approach $10^9$ bits per chip, the requirement is becoming increasingly difficult to fulfil in silicon technology, and there is a wide interest in a group of alternative materials. By using high dielectric constant perovskite materials such as strontium titanate (STO) (bulk dielectric constant $\epsilon_{bulk}$=300), or barium strontium titanate (BST) ($\epsilon_{bulk}$ exceeding 500 depending on composition), adequate capacitors could theoretically fit into the bit area up to and beyond 1 Gbit, provided the capacitors contain the dielectric in the form of a very thin film.

However, it has been found experimentally that the very high dielectric constants characteristic of the bulk, which constitute the advantage of the perovskite materials, are found in films having a thickness of about 400 nm. and thicker. However, in thinner films (e.g., less than 400 nm. thick), the effective dielectric constant drops with decreasing thickness. The film dielectric constant $\epsilon_{film}$ of a film of thickness d is approximately represented by the formula $$\epsilon_{film} = \epsilon_{bulk}/(1+d_0/d),$$

where $d_0$ is an empirical parameter, for example found to be 30 nm. in one instance of a series of STO films.

This is a fundamental problem, since the reduction in dielectric constant in thin films of high dielectric constant material is widely prevalent.

The above formula implies that the capacitance C relates to film thickness as:

$$C \; \epsilon_{bulk}/(d+d_0),$$

showing that as film thickness d goes to zero, the right hand side of this expression saturates at $\epsilon_{bulk}/d_0$, and cannot increase further.

Hence, as films of high dielectric constant material such as STO (strontium titanate) and BST (barium strontium titanate) are made progressively thinner with the objective of approaching realistic capacitances per unit area, a film thickness is reached where no significant further increase in capacitance results from a further decrease in film thickness, and it becomes questionable as to whether they can reach the required specification for DRAM applications.

In C. Zhou and D. M. Newns, *J. Appl. Phys.* 82, 3081 (1997), the present inventor, with C. Zhou, developed a theory of this effect which is able to explain both the characteristic dependence of the film dielectric constant $\epsilon_{bulk}$ on film thickness d (the dependence shown in the above equations), but also the dependence of $\epsilon_{film}$ on temperature T, which gives the theory some degree of credibility. The explanation of the phenomenon given by the theory of C. Zhou and D. M. Newns, *J. Appl. Phys.* 82, 3081 (1997) is as follows.

There is found theoretically to be a region at the surface of the dielectric film of high dielectric constant material where the dielectric constant is significantly depleted below that in the interior of the film, which for moderately thin films is the same as the bulk dielectric constant $\epsilon_{bulk}$. This surface region, sometimes referred to as the "dead layer", of depleted dielectric constant is responsible for the reduced film dielectric constant $\epsilon_{film}$.

The basic origin of the high dielectric constants in this class of materials is an interaction between the dipoles in each unit cell of the material which is favorable to a self-alignment of all the dipoles in a parallel direction so as to form a large dielectric polarization. However, at the interface between the dielectric film and one of the electrodes, dipoles do not see (e.g., are not near) any neighboring dipoles outside the interface, as there would be if the dipoles in question lay within the interior of a bulk crystal. Hence, the average number of neighboring dipoles is less for dipoles located near the interface. Thus, these dipoles have a reduced self-alignment tendency, due to the reduced number of neighbors, relative to dipoles located in bulk.

Hence, as a result of this reduced self-alignment tendency, surface dipoles are more weakly polarized than bulk ones, leading to a region of reduced dielectric constant near the interface with the electrodes, and hence to a reduced dielectric constant in the interface region of the film.

Another problem occurring with some perovskite dielectrics is that leakage current may be excessive, leading to an inconveniently short refresh time for the DRAM fabricated from such a material. A desirable limit on leakage resistance would be $10^8$ Ohm cm$^{-2}$ per unit area of capacitance.

SUMMARY OF THE INVENTION

In view of the foregoing and other problems of the conventional methods and structures, an object of the present invention is to provide a very thin film capacitor for a dynamic random access memory (DRAM) and a method of forming the same.

Another object is to provide a method and structure in which as films of high-dielectric-constant materials such as STO (strontium titanate) and BST (barium strontium titanate) are made progressively thinner so as to approach realistic capacitances per unit area, the dielectric constants are made to reach the required specification for DRAM applications.

Yet another object is to provide a structure and method in which the capacitance per unit area required for a 1 Gbit DRAM is achieved.

Based on the above theoretical explanation and experimental support, the present invention mitigates the reduction in dielectric constant in thin films due to the interface of the dielectric with the electrodes, by using electrode materials which are the same as the dielectric material except that they have been made conducting due to the presence of a low concentration of a suitable dopant.

Hence, on one hand, these electrodes are, due to the presence of dopant, such as between about 0.1% and 1% Nb, adequately conducting. On the other hand, these electrodes include (e.g., are formed of) exactly the same material as the dielectric itself. Therefore, the interactions between dipoles at the dielectric-electrode interface should be close to those acting within the dielectric itself. Therefore, the tendency for the dipoles to line up should be impaired to a lesser degree than is the case at a conventional dielectric-electrode interface, thereby resulting in a reduced dead layer effect and an enhanced thin film capacitance.

A further cause of the "dead layer effect" may be structural disorder at the dielectric/electrode interface. Forming an epitaxial interface with an electrode constituted from a doped, conducting perovskite material should eliminate this cause of reduced surface dielectric constant, even if the electrode is not a high dielectric constant material.

In one aspect of the present invention, a capacitor is provided which includes (e.g., consists of) a layer of conducting, doped perovskite material, (e.g., n-type or p-type polarity), in contact with a layer of another conducting, doped perovskite of opposite polarity (e.g, the other of n-type or p-type (e.g., see FIG. 1A). A depletion layer is formed at the interface between the two conducting perovskite materials which acts as the insulating layer in the capacitor (e.g., see FIG. 1B).

In another aspect of the present invention (e.g., see FIG. 2), a capacitor is provided which includes a first electrode, a second electrode opposing the first electrode, and a thin film of high dielectric constant perovskite material sandwiched between the first and second electrodes. At least one of the first and second electrodes is formed from substantially the same perovskite material in conducting, doped form.

In a third aspect of the present invention (e.g., see FIG. 3), a very thin film capacitor includes first and second doped, conducting perovskite layers, and an insulating perovskite layer sandwiched between the first and second conducting perovskite layers.

In a fourth aspect of the present invention (e.g., see FIG. 4), a capacitor is formed on a substrate including a doped perovskite conducting ground plane, the surface of which is lithographed to form a brick-shaped "stack" projecting out of its surface. A layer of conducting perovskite, doped so as to have opposite polarity to the ground plane material, is deposited upon this lithographed structure, to form the top electrode. An insulating inversion layer is formed between the two electrodes, which acts as the insulator in the capacitor.

In a fifth aspect of the present invention (e.g., see FIG. 5), a capacitor is formed within a substrate including a doped perovskite conducting ground plane, by embedding a layer of ions, using a technique such as ion implantation, the ions being selected in type and concentration so as to compensate the dopant in the ground plane material so as to render it insulating within the region where a sufficient concentration of the implanted ions occurs. The implanted region forms the insulator in the capacitor.

In other aspects of the present invention, dynamic random access memories (DRAMs) including at least one of the above capacitors are provided.

With the unique and unobvious aspects of the present invention, a better solution to the problems of the conventional methods and designs is provided, in that the present invention provides a very thin film capacitor for a dynamic random access memory (DRAM) and a method of forming the same.

Further, with the invention, as films of high-dielectric constant materials (e.g., STO, BST, and the like) are made thinner to approach the desired capacitance per unit area, the dielectric constants reach the required specification for DRAM applications.

Additionally, experimental data on some embodiments of the invention (e.g., FIG. 1A) have demonstrated adequately high leakage resistance of order $10^8$ Ohms $cm^{-2}$.

BRIEF DESCRIPTION OF THE DRAWINGS

The foregoing and other purposes, aspects and advantages will be better understood from the following detailed description of preferred embodiments of the invention with reference to the drawings, in which:

FIG. 5 illustrates a capacitor structure 500 including an implanted layer of ions designed to form a compensated insulating layer within the conducting ground plane, which forms the insulator in the capacitor structure according to a fifth embodiment of the present invention.

DETAILED DESCRIPTION OF PREFERRED EMBODIMENTS OF THE INVENTION

Figure 1A:
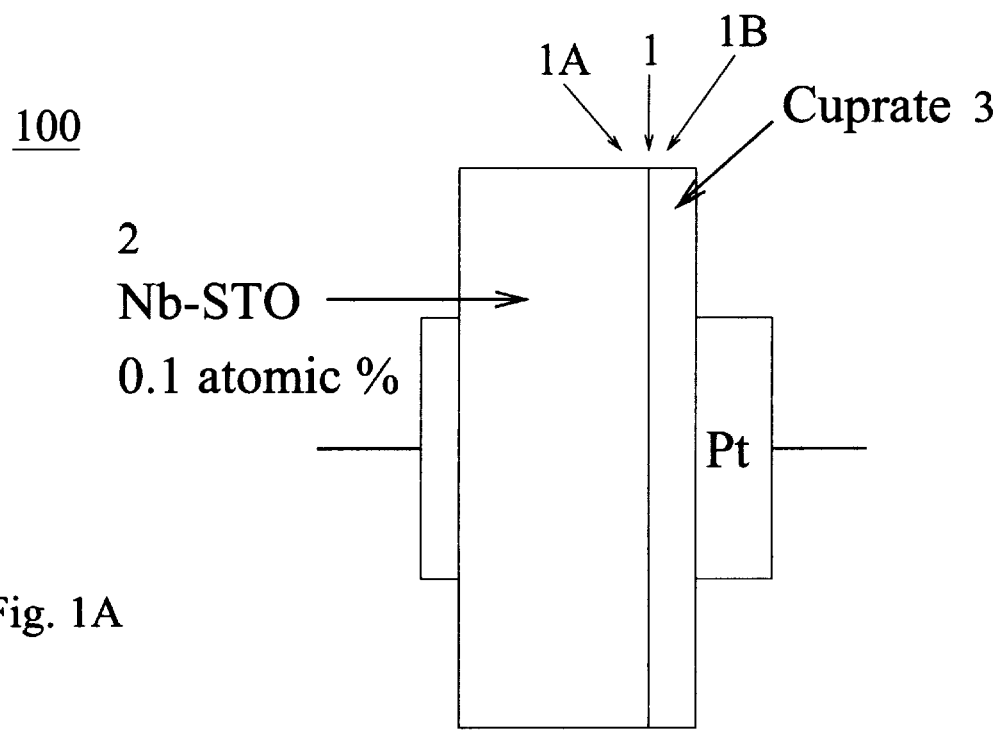
FIG. 1A illustrates a capacitor structure 100 including a cuprate layer deposited onto a Nb-doped STO substrate.

Referring now to the drawings, and more particularly to FIGS. 1A–5, there are shown preferred embodiments of the method and structures according to the present invention.

Generally, the present invention specifies at least one of a plurality of electrodes in a capacitor structure as being formed from a conducting, doped version of the perovskite material constituting the capacitor dielectric. Accordingly, the interaction between the dipoles is no longer cut off by the surface of the dielectric.

Therefore, the dielectric constant of the material in the thin film dielectric of the capacitor retains a value closer to the bulk value.

Preferably, two doped perovskite electrodes are employed, thereby resulting in even greater performance than when only one doped perovskite electrode is used and the other electrode is made from a different material.

For example, for an STO dielectric, an appropriate material for the electrodes would be the well-known Nb-doped STO material (e.g., with doping ranges of substantially about 0.1 to about 1.0 atomic percent Nb relative to Ti). Other possible materials are La-doped STO and SRO (strontium ruthenate).

Further, as discussed in further detail below, the present invention includes a capacitor with one electrode including (and more preferably consisting of) Nb-doped STO using the concept of the depletion layer capacitor well-known in semiconductor physics. With such a structure, the invention obtained a capacitance per unit area which is equal to a published benchmark for a 1 Gbit DRAM. Also, with this structure, the benchmark of a leakage resistance of $10^8$ Ohms $cm^{-2}$ was reached. Additionally, when the variation of the capacitance with depletion layer thickness was measured experimentally, indications of the presence of "dead layers" at the surface of the dielectric were absent.

Specifically, based on the theoretical analysis developed earlier in C. Zhou and D. M. Newns, *J. Appl. Phys.* 82, 3081 (1997), incorporated herein by reference, a solution to the problems of conventional methods and structures has been found by the present inventor. Further, as discussed below, an experiment was performed in which the capacitance per unit area required for a 1 Gbit DRAM was achieved.

First Embodiment

Figure 1B:
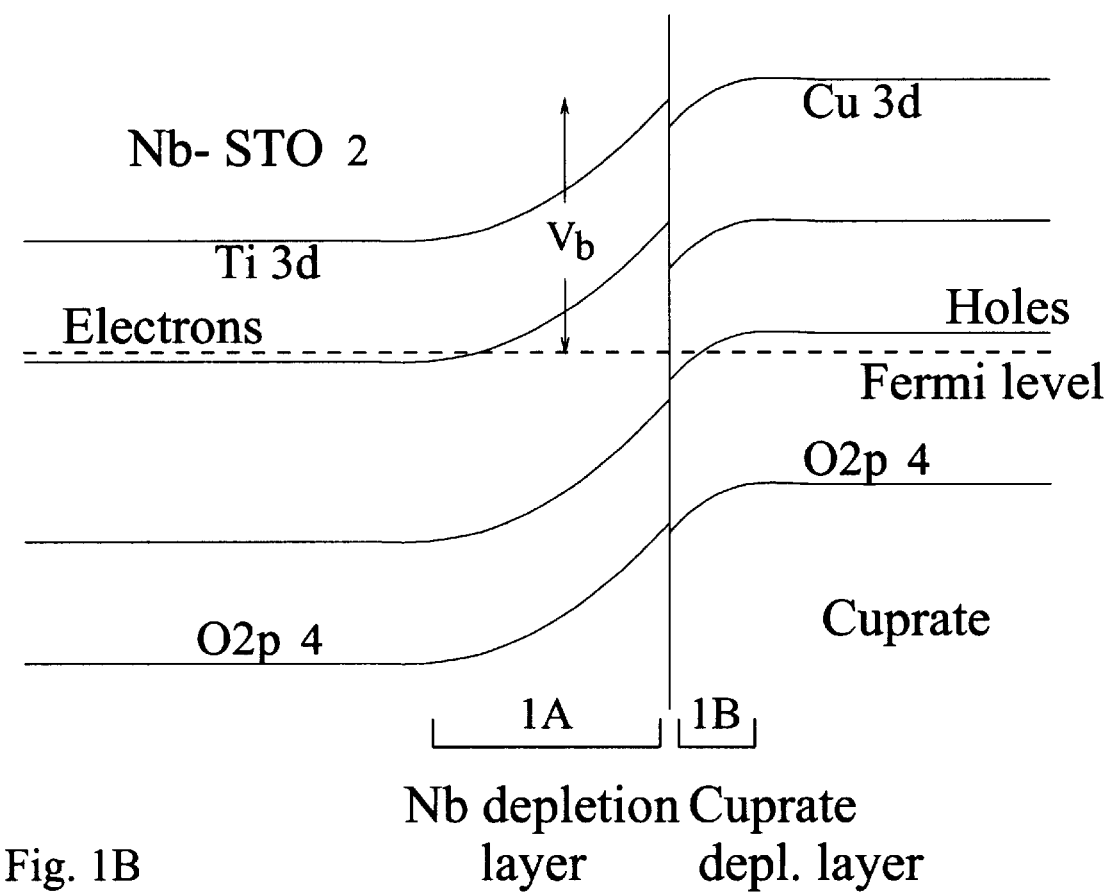
FIG. 1B illustrates band bending at the cuprate-STO interface, illustrating the formation of an insulating inversion layer.

In a first embodiment of the present invention, as shown in FIGS. 1A–1B, a depletion layer structure is formed within a doped perovskite (e.g., doped Nb-STO as but one example as mentioned above).

As shown in FIG. 1A, such a structure 100 was formed using the interface 1 between a Nb-doped STO layer 2 (e.g., a 0.1% Nb-doped STO layer) and a cuprate material 3 (e.g., $Y_{0.5}Pr_{0.5}Ba_2Cu_3O_7$), as shown in FIG. 1A.

The Nb-STO layer 2 is n-type, while the cuprate material 3 is p-type. Obviously, the conductivity of these materials could be reversed.

Assuming that at the interface 1, the oxygen bands 4 (as shown in FIG. 1B) on each side of the interface approximately line up (e.g., match), and the metal bands on each side also approximately line up (e.g., the Ti and Cu bands shown in FIG. 1B), then equalization of the Fermi levels in the two materials will cause depletion layers 1A, 1B to be formed at the interface 1. Application of the standard formula for depletion layer thickness shows that the cuprate depletion layer 1B will be very thin (e.g., substantially within a range of about 0.4 nm to about 1.0 nm). The STO depletion layer 2 is on the order of about 50 nm. If the layer 2 is too thin, it is anticipated that a very narrow range, if any, of usable voltage will be provided. In contrast, if the layer is too thick, then the capacitance will be unsuitably low. It is noted that the above-mentioned thickness is merely exemplary and was limited by commercial availability of doped Nb substrates.

Hence, the structure formed by the cuprate 3-interface depletion layer 1-conducting STO 2 sandwich forms a capacitor.

In the first embodiment, only one electrode of the capacitor is of substantially the same material as the dielectric. By the same token, if p-type STO is available, the p-type STO will form a replacement for the cuprate 3, thereby enabling both electrodes to be homogeneous with the dielectric.

It is noted that in lieu of STO (strontium titanate), BST (barium strontium titanate) may be employed as the doped perovskite material.

In an exemplary method of forming the capacitor, cuprate material was deposited in a thickness of approximately 10 nm. thick by laser ablation on a cleaned, stepped 0.1% Nb-STO substrate. Pt electrodes were evaporated on the cuprate layer through a stencil mask.

Measurements were performed in accordance with the teachings of D. M. Newns et al. "The JMTFET: a Reductionist but Potent MTFET Device", *IBM Report,* publication date to be determined, incorporated herein by reference, for the device illustrated in FIG. 1A. It was found that, at zero bias, the depletion layer thickness is estimated as 53 nm. and the dielectric constant as 190. These measurements are equivalent to acceptable specifications, regarding the capacitance of the device for a 1 Gbit DRAM. An exemplary capacitance found was 3.5 $\mu F$ $cm^{-2}$. Using BST should provide much larger capacitance values.

Capacitance was measured by simultaneously applying an oscillating AC voltage (e.g., typically 10 mV at 10 Hz.) simultaneously with a DC bias voltage, using a lock-in amplifier as a detector. The measurements of capacitance as a function of voltage V can be interpreted, using the standard theory of a depletion layer, as measurements of capacitance as a function of depletion layer thickness. As such, the measurements do not show any evidence of the "dead layer effect", which would show a downward convexity in the $1/C^2$ vs. V plot. Thus, this measurement provides support for the efficacy of the structure of the present invention.

Thus, with the present invention, a very thin film capacitor is provided for dynamic random access memory (DRAM) applications (e.g., an effective thickness of approximately 40 nm.).

Moreover, the films of high-dielectric-constant materials (e.g., STO, BST, and the like) can be made thinner to approach desired capacitances per unit area, and the dielectric constants reach the required specification for DRAM applications.

Second Embodiment

Figure 2:
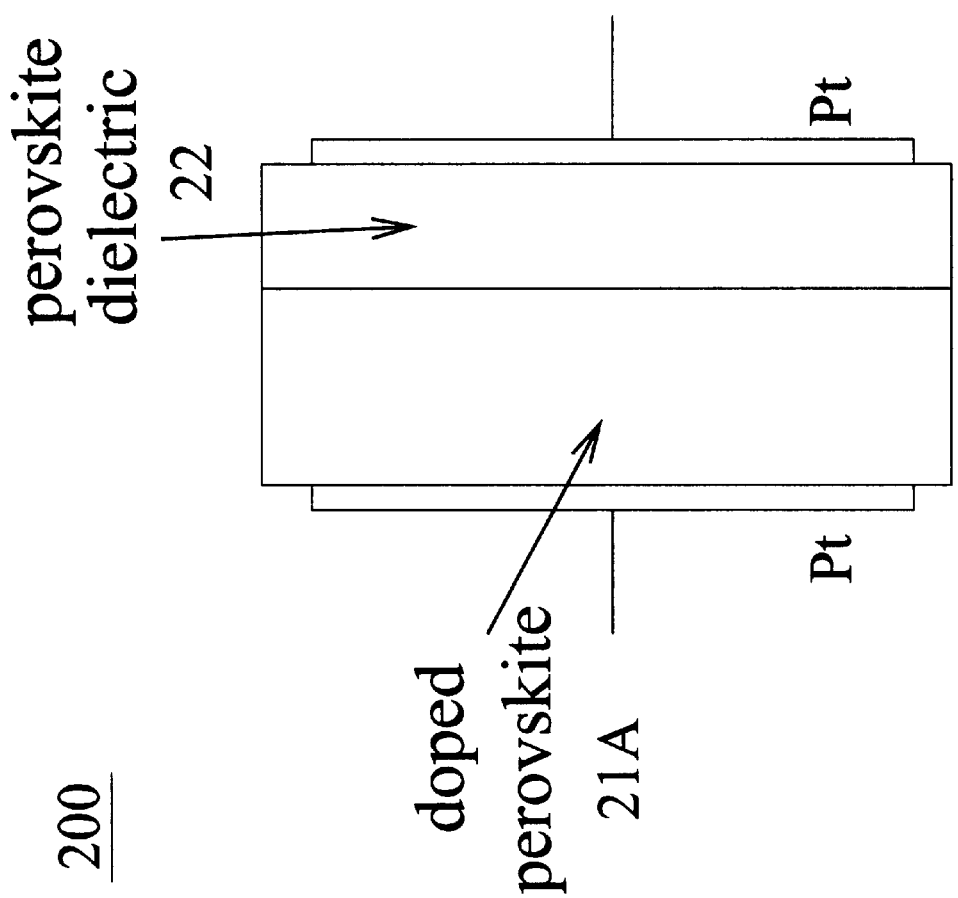
FIG. 2 illustrates a capacitor structure 200 including a doped perovskite-insulating perovskite-electrode sandwich according to a second embodiment of the present invention.

In a second embodiment of the present invention, a structure 200 as shown in FIG. 2, is provided with an electrode(Pt)-insulating perovskite 22-conducting perovskite 21A arrangement.

Structure 200 can be formed by depositing insulating perovskite 22 onto conducting perovskite 21A by laser ablation, or by ion implanting a compensating ion, such as Mg, into a conducting perovskite substrate. This embodiment shares the advantages of the first embodiment, but over a wider range of voltages for the same dielectric thicknesses.

Third Embodiment

Figure 3:
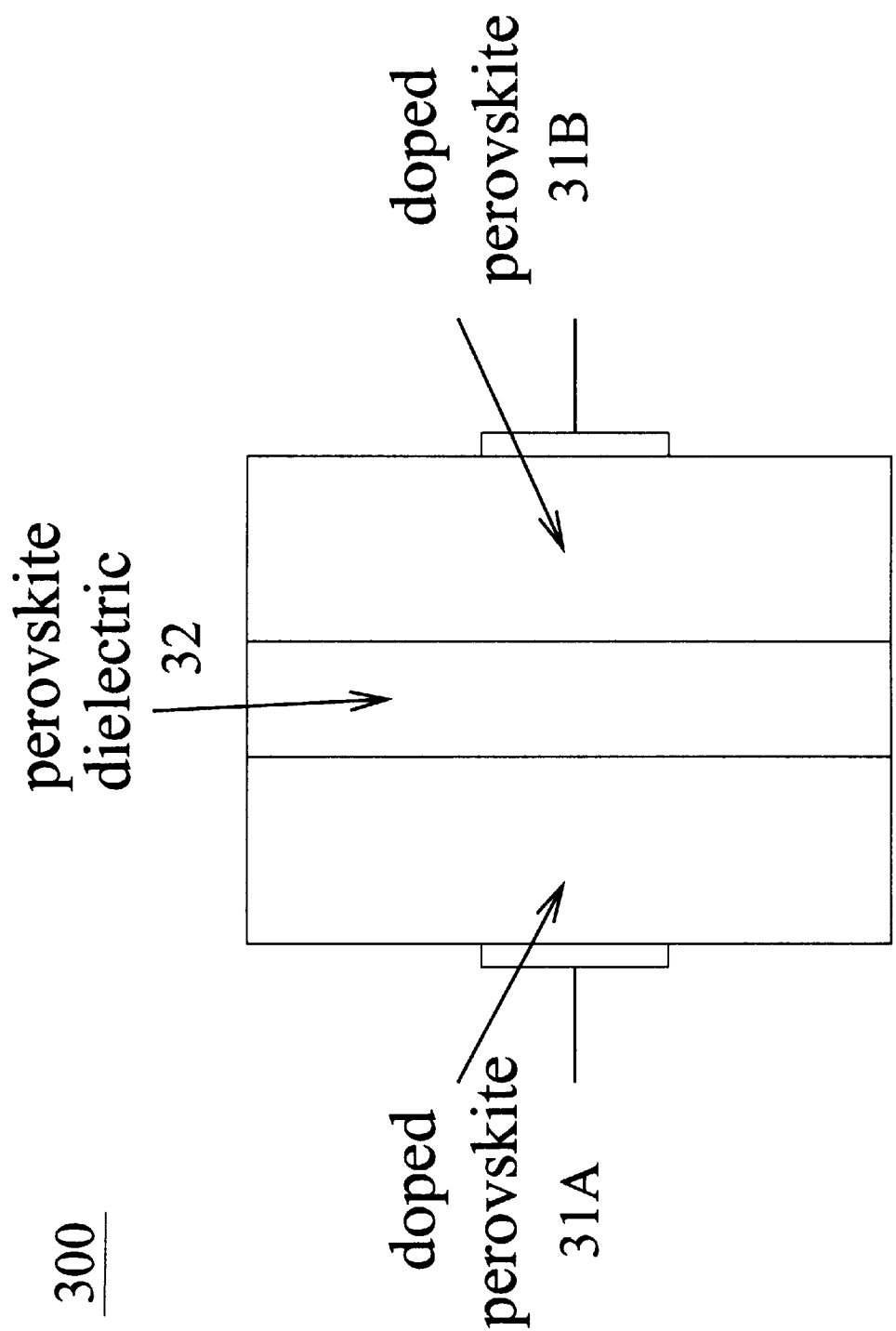
FIG. 3 illustrates a capacitor structure 300 including a doped perovskite-insulating perovskite-doped perovskite sandwich according to a third embodiment of the present invention.

In a third embodiment of the present invention, a structure 300 as shown in FIG. 3 is formed by laser ablation, molecular beam etching (MBE) or the like (e.g., by ion implanting a compensating ion, such as Mg, into the doped material to form insulating layer 32).

Specifically, the sandwich structure 300 includes a conducting perovskite layer 31A, an insulating perovskite layer 32, and a conducting perovskite layer 31B. Such a structure may be formed, for example, with Nb-STO as the material for both conducting layers 31A, 31B. However, other materials are usable such as BST which would be preferable over Nb-STO. For example, the material for insulating perovskite layer 32 preferably is BST, in which case preferable arrangements would be doped BST-insulating BST-doped BST or doped STO-insulating BST-doped STO.

Briefly, as mentioned above, the structure is formed by MBE or by ion implanting a compensating ion, such as Mg, into the doped material to form insulating layer 32.

The operation of this device is substantially the same as that of FIG. 1A, with the exception that in principle, two electrodes made of the same material should function better than only one electrode. Thus, the third embodiment is believed preferable to the first embodiment.

The third embodiment includes all of the advantages of the first embodiment, but the third embodiment will be harder to fabricate but will have further advantages of having higher capacitance and being operable over a wider voltage range. Thus, the first embodiment is simpler to fabricate but the third embodiment (and the second embodiment discussed above) should work better and have higher performance.

Fourth Embodiment

Figure 4:
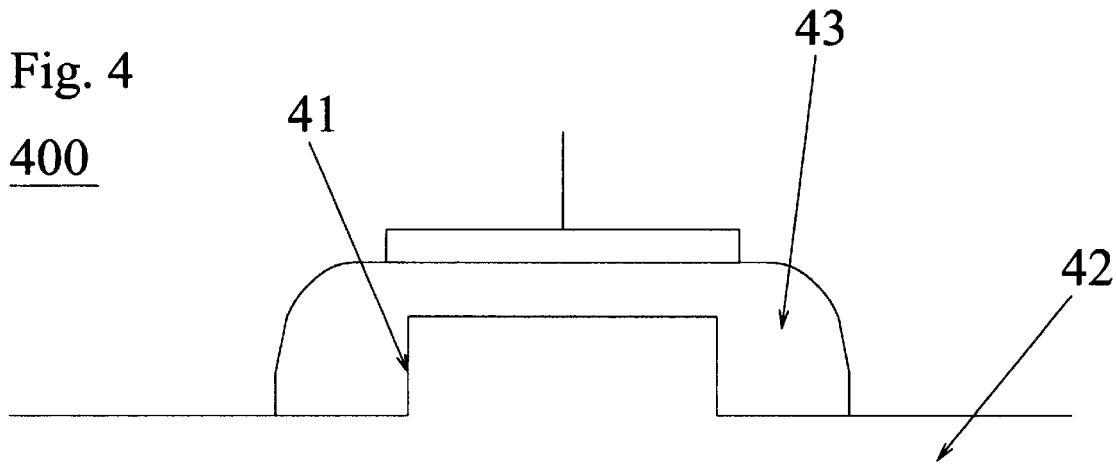
FIG. 4 illustrates a capacitor structure 400 including a depletion layer formed by depositing a perovskite with opposite doping polarity onto a lithographed projection (e.g., a "stack") on a doped perovskite ground plane according to a fourth embodiment of the present invention.
Figure 4:
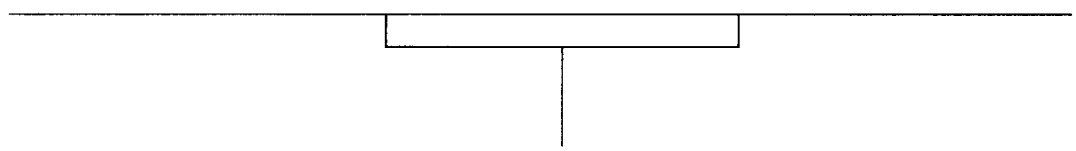

In a fourth embodiment of the present invention, a structure 400 as shown in FIG. 4 is formed. Generally, FIGS. 4 and 5 discussed below, show structures which embody additional area which is necessary in all realistic designs. BST used with the present invention should work with simple planar structures.

FIG. 4 is analogous to the first embodiment of FIG. 1A, and illustrates a capacitor structure 400 including a depletion layer formed by depositing a perovskite with opposite doping polarity onto a lithographed projection (e.g., a "stack") on a doped perovskite ground plane.

Thus, in the fourth aspect of the present invention as shown in FIG. 4, a capacitor is formed on a substrate formed by a doped perovskite conducting ground plane 42, the surface of which is lithographed to form a brick-shaped "stack" 41 projecting out of its surface. A layer 43 of conducting perovskite, doped so as to have opposite polarity to the ground plane material, is deposited upon this lithographed structure, to form the top electrode (unreferenced). An insulating inversion layer (not shown) is formed between the two electrodes, which acts as the insulator in the capacitor.

Fifth Embodiment

In a fifth embodiment of the present invention, a structure 500 as shown in FIG. 5 is formed. FIG. 5 is analogous to the third embodiment and has electrically similar properties. Similarly to FIG. 4, both structures allow for larger capacitance per unit surface area.

FIG. 5 illustrates a capacitor structure 500 involving an implanted layer of ions designed to form a compensated insulating layer within a conducting ground plane, which forms the insulator in the capacitor structure. Region 52 is the ion-implanted region which is insulating.

More specifically, in the fifth aspect of the present invention, a capacitor 500 is formed within a substrate formed of a doped perovskite conducting ground plane 51B, by embedding a layer of ions 52 (e.g., Mg or the like depending on the dopant of the ground plane 51B), using a technique such as ion implantation. The ions are selected in type and concentration, to compensate the dopant in the ground plane material 51B so as to render it insulating within the region 52 where a sufficient concentration of the implanted ions occurs. A "sufficient" amount depends on the charge of ions vs. the charge of the dopant. If these charges are equal, the concentration of the ions should slightly exceed the concentration of dopant. Thus, "sufficient" depends on the concentration of the dopant in the ground plane. Thus, the implanted region 52 forms the insulator in the capacitor 500. Region 51A represents a conducting doped perovskite.

While the invention has been described in terms of several preferred embodiments, those skilled in the art will recognize that the invention can be practiced with modification within the spirit and scope of the appended claims.

What is claimed is:

1. A capacitor including:

a first layer of conducting, doped perovskite material;

a second layer of another conducting, doped perovskite of opposite polarity in contact with said first layer; and a depletion layer formed at an interface between the first and second layers of conducting perovskite materials, said depletion layer functioning as an insulating layer of said capacitor and being devoid of carriers.

2. The capacitor according to claim 1, wherein one of said first and second layers is selected from the group comprising strontium titanate (STO) and barium strontium titanate (BST) in conducting, doped form and the other of said first and second layers is formed from cuprate material.

3. The capacitor according to claim 2, wherein the one of said first and second layers is said STO which is 0.1% Nb-doped STO.

4. The capacitor according to claim 2, wherein the one of said first and second layers is said STO which is 0.1% Nb-doped STO and the other of said first and second layers is $Y_{0.5}Pr_{0.5}Ba_2Cu_3O_7$.

5. The capacitor according to claim 2, wherein one of said first and second layers has a first conductivity-type and the other of said first and second layers has a second conductivity-type opposite that of said first conductivity-type.

6. The capacitor according to claim 1, wherein said depletion layer is enhanced with a bias applied to said first and second layers.

7. The capacitor according to claim 1, wherein said depletion layer is formed at a P-N junction of said first and second layers without any undoped insulator being present.

8. A capacitor including:

a first layer of conducting, doped perovskite material;

a second layer of another conducting, doped perovskite of opposite polarity in contact with said first layer; and a depletion layer formed at an interface between the first and second layers of conducting perovskite materials, said depletion layer functioning as an insulating layer of said capacitor, wherein one of said first and second layers is formed of strontium titanate (STO) having a first conductivity-type, and wherein the other of said first and second layers is formed of a perovskite material having a second conductivity-type opposite that of said first conductivity-type, such that said first and second layers are substantially homogeneous with said depletion layer.

9. A capacitor, comprising:

a substrate including a doped perovskite conducting ground plane, the surface of said ground plane being lithogaphed to form a stack projecting out of the surface of the ground plane and functioning as a first electrode;

a layer of conducting perovskite, doped so as to have opposite polarity to the ground plane material, being deposited upon the lithographed surface, to form a second electrode; and an insulating inversion layer being formed between the first and second electrodes, thereby functioning as an insulator for said capacitor, wherein one of said first and second electrodes is formed of strontium titanate (STO) having a first conductivity-type, and wherein the other of said first and second electrodes is formed of a perovskite material having a second conductivity-type opposite that of said first conductivity-type, such that said first and second electrodes are substantially homogeneous with said insulating inversion layer.

10. A capacitor, comprising:

a substrate including a doped perovskite conducting ground plane, having a layer of ions embedded therein, the ions being selected in type and concentration so as to compensate a dopant in the ground plane material so as to render the ground plane insulating within a region where a predetermined sufficient concentration of implanted ions occurs, the implanted region forming an insulator in said capacitor.

11. A capacitor, comprising:

a substrate including a doped perovskite conducting ground plane, the surface of said ground plane being lithographed to form a stack projecting out of the surface of the ground plane and functioning as a first electrode;

a layer of conducting perovskite, doped so as to have opposite polarity to the ground plane material, being deposited upon the lithographed surface, to form a second electrode; and an insulating inversion layer being formed between the first and second electrodes, thereby functioning as an insulator for said capacitor, and being devoid of carriers.

12. The capacitor according to claim 11, wherein one of said first and second electrodes is selected from the group comprising strontium titanate (STO) and barium strontium titanate (BST) and the other of said first and second electrodes is formed from cuprate material.

13. The capacitor according to claim 12, wherein the one of said first and second layers is said STO which is 0.1% Nb-doped STO.

14. The capacitor according to claim 12, wherein the one of said first and second layers is said STO which is 0.1% Nb-doped STO and the other of said first and second layers is $Y_{0.5}Pr_{0.5}Ba_2Cu_3O_7$.

15. The capacitor according to claim 11, wherein one of said first and second electrodes has a first conductivity-type and the other of said first and second electrodes has a second conductivity-type opposite that of said first conductivity-type.

16. The capacitor according to claim 11, wherein said insulating inversion layer is enhanced with a bias applied to said first and second electrodes.

17. The capacitor according to claim 11, wherein said insulating inversion layer is formed at a P-N junction of said first and second electrodes, without any undoped insulator being present.

18. A dynamic random access memory (DRAM) including:

a capacitor, said capacitor comprising:

a substrate including a doped perovskite conducting ground plane, the surface of said ground plane being lithographed to form a brick-shaped stack projecting out of the surface of the ground plane and functioning as a first electrode;

a layer of conducting perovskite, doped so as to have opposite polarity to the ground plane material, being deposited upon the lithographed surface, to form a second electrode; and an insulating inversion layer being formed between the first and second electrodes, thereby functioning as an insulator for said capacitor, wherein one of said first and second electrodes is formed of strontium titanate (STO) having a first conductivity-type, and wherein the other of said first and second electrodes is formed of a perovskite material having a second conductivity-type opposite that of said first conductivity-type, such that said first and second electrodes are substantially homogeneous with said insulating inversion layer.

19. A dynamic random access memory (DRAM) including:

a capacitor, said capacitor comprising:

a substrate including a doped perovskite conducting ground plane, having a layer of ions embedded therein, the ions being selected in type and concentration to compensate the dopant in the ground plane material so as to render the ground plane insulating within a region where a predetermined sufficient concentration of implanted ions occurs, the implanted region forming an insulator in said capacitor.

20. A dynamic random access memory (DRAM) including:

a capacitor, said capacitor comprising:

a substrate including a doped perovskite conducting ground plane, the surface of said ground plane being lithographed to form a stack projecting out of the surface of the ground plane and functioning as a first electrode;

a layer of conducting perovskite, doped so as to have opposite polarity to the ground plane material, being deposited upon the lithographed surface, to form a second electrode; and an insulating inversion layer being formed between the first and second electrodes, thereby functioning as an insulator for said capacitor, and being devoid of carriers.

21. The DRAM according to claim 20, wherein one of said first and second electrodes is selected from the group comprising strontium titanate (STO) and barium strontium titanate (BST) and the other of said first and second electrodes is formed from cuprate material.

22. The capacitor according to claim 21, wherein the one of said first and second layers is said STO which is 0.1% Nb-doped STO.

23. The capacitor according to claim 21, wherein the one of said first and second layers is said STO which is 0.1% Nb-doped STO and the other of said first and second layers is $Y_{0.5}Pr_{0.5}Ba_2Cu_3O_7$.

24. The DRAM according to claim 20, wherein one of said first and second electrodes has a first conductivity-type and the other of said first and second electrodes has a second conductivity-type opposite that of said first conductivity-type.

25. The DRAM according to claim 20, wherein said insulating inversion layer is enhanced with a bias applied to said first and second electrodes.

26. The DRAM according to claim 20, wherein said insulating inversion layer is formed at a P-N junction of said first and second electrodes, without any undoped insulator being present.

* * * * *